United States Patent
Pollard et al.

(10) Patent No.: US 12,290,897 B2
(45) Date of Patent: May 6, 2025

(54) FLUID-TIGHT ELECTRICAL CONNECTION TECHNIQUES FOR SEMICONDUCTOR PROCESSING

(71) Applicant: Applied Materials, Inc., Santa Clara, CA (US)

(72) Inventors: Chad Pollard, San Jose, CA (US); Shou-Sung Chang, Mountain View, CA (US); Haosheng Wu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 377 days.

(21) Appl. No.: 17/974,281

(22) Filed: Oct. 26, 2022

(65) Prior Publication Data

US 2023/0387625 A1  Nov. 30, 2023

Related U.S. Application Data

(60) Provisional application No. 63/346,811, filed on May 27, 2022.

(51) Int. Cl.
*F16L 11/127*  (2006.01)
*B24B 53/017*  (2012.01)
(Continued)

(52) U.S. Cl.
CPC ............ *B24B 57/02* (2013.01); *B24B 53/017* (2013.01); *F16L 11/127* (2013.01);
(Continued)

(58) Field of Classification Search
CPC .. F16L 11/127; H01R 13/5205; H01R 13/622
See application file for complete search history.

(56) References Cited

U.S. PATENT DOCUMENTS

| 3,070,132 A | 12/1962 | Sheridan |
| 3,580,983 A | 5/1971 | Jackson |

(Continued)

FOREIGN PATENT DOCUMENTS

| CN | 2895950 | 5/2007 |
| CN | 201014075 | 1/2008 |

(Continued)

OTHER PUBLICATIONS

Office Action in Taiwanese Appln. No. 111140691, dated Jul. 4, 2023, 15 pages (with English summary and search report).

(Continued)

*Primary Examiner* — Briggitte R. Hammond
(74) *Attorney, Agent, or Firm* — Fish & Richardson P.C.

(57) ABSTRACT

A chemical mechanical polishing assembly includes a chemical mechanical polishing system, a fluid source, and a fluid delivery conduit to carry a fluid from the fluid source into the chemical mechanical polishing system. The polishing system has a platen to support a polishing pad, a carrier head to support a substrate and bring the substrate into contact with the polishing pad, and a motor to cause relative motion between platen and the carrier head. The fluid delivery conduit includes a conductive wire extending through an interior of the conduit to flow electrostatic discharge to a ground, and a wire extraction fitting covering and sealing a location where the conductive wire passes through a wall of the fluid delivery conduit.

18 Claims, 4 Drawing Sheets

(51) Int. Cl.
  *B24B 57/02* (2006.01)
  *H01L 21/67* (2006.01)
  *H01R 13/52* (2006.01)
  *H01R 13/622* (2006.01)
(52) U.S. Cl.
  CPC ... *H01L 21/67017* (2013.01); *H01R 13/5205* (2013.01); *H01R 13/622* (2013.01)

(56) References Cited

U.S. PATENT DOCUMENTS

| | | |
|---|---|---|
| 3,780,208 A | 12/1973 | Jenks |
| 4,290,260 A | 9/1981 | Wasserman |
| 4,302,926 A | 12/1981 | Maixner et al. |
| 4,313,998 A | 2/1982 | Pivot et al. |
| 4,647,495 A | 3/1987 | Kanayama et al. |
| 4,755,716 A | 7/1988 | Hayafune et al. |
| 4,777,789 A | 10/1988 | Kolmes et al. |
| 4,838,017 A | 6/1989 | Kolmes et al. |
| 4,886,691 A | 12/1989 | Wincklhofer |
| 4,912,781 A | 4/1990 | Robbins et al. |
| 4,982,597 A | 1/1991 | Berger |
| 5,005,610 A | 4/1991 | Davenport |
| 5,062,161 A | 11/1991 | Sutton |
| 5,076,242 A | 12/1991 | Parker |
| 5,423,168 A | 6/1995 | Kolmes et al. |
| 5,427,880 A | 6/1995 | Tamura et al. |
| 5,614,589 A | 3/1997 | Niznik et al. |
| 5,632,137 A | 5/1997 | Kolmes et al. |
| 5,670,284 A | 9/1997 | Kishi et al. |
| 5,699,680 A | 12/1997 | Guerlet et al. |
| 5,721,179 A | 2/1998 | Shi et al. |
| 5,727,357 A | 3/1998 | Arumugasaamy et al. |
| 5,740,734 A | 4/1998 | Mori et al. |
| 5,806,295 A | 9/1998 | Robins et al. |
| 5,855,169 A | 1/1999 | Mori et al. |
| 5,881,547 A | 3/1999 | Chiou et al. |
| 5,898,560 A | 4/1999 | Flaynik et al. |
| 5,927,060 A | 7/1999 | Watson |
| 6,016,648 A | 1/2000 | Bettcher et al. |
| 6,033,779 A | 3/2000 | Andrews |
| 6,132,871 A | 10/2000 | Andrews |
| 6,216,431 B1 | 4/2001 | Andrews |
| 6,328,080 B1 | 12/2001 | Winters |
| 6,354,331 B1 | 3/2002 | Fisher et al. |
| 6,363,703 B1 | 4/2002 | Kolmes |
| 6,639,148 B2 | 10/2003 | Marks |
| 6,679,297 B1 | 1/2004 | Nishi et al. |
| 6,777,056 B1 | 8/2004 | Boggs et al. |
| 6,779,330 B1 | 8/2004 | Andrews et al. |
| 6,800,367 B2 | 10/2004 | Hanyon et al. |
| 6,803,332 B2 | 10/2004 | Andrews |
| 6,843,078 B2 | 1/2005 | Rock et al. |
| 7,102,077 B2 | 9/2006 | Aisenbrey |
| 8,411,405 B2 | 4/2013 | Blackburn et al. |
| 9,046,201 B1 | 6/2015 | Theis |
| 9,056,264 B2 | 6/2015 | Hahn et al. |
| 9,618,145 B2 | 4/2017 | Brown et al. |
| 11,339,063 B2 | 5/2022 | Leys et al. |
| 11,446,711 B2 | 9/2022 | Wu et al. |
| 2002/0029619 A1 | 3/2002 | Lee |
| 2003/0098085 A1 | 5/2003 | Ito et al. |
| 2003/0150503 A1 | 8/2003 | Ito et al. |
| 2004/0065072 A1 | 4/2004 | Zhu et al. |
| 2004/0237494 A1 | 12/2004 | Karaylanni et al. |
| 2005/0028512 A1 | 2/2005 | Boni |
| 2005/0124249 A1 | 6/2005 | Uribarri |
| 2005/0282009 A1 | 12/2005 | Nusko |
| 2007/0259147 A1 | 11/2007 | Boudry et al. |
| 2007/0275199 A1 | 11/2007 | Chen |
| 2009/0032408 A1 | 2/2009 | Chen et al. |
| 2010/0035526 A1 | 2/2010 | Tolles et al. |
| 2010/0116941 A1 | 5/2010 | Ciolcyzk et al. |
| 2012/0024411 A1 | 2/2012 | Hahn et al. |
| 2016/0332278 A1 | 11/2016 | Shibuya et al. |
| 2017/0290133 A1 | 10/2017 | Parker |
| 2020/0195260 A1 | 6/2020 | Sato |
| 2021/0053183 A1 | 2/2021 | Zuniga et al. |
| 2023/0381922 A1 | 11/2023 | Pollard et al. |

FOREIGN PATENT DOCUMENTS

| | | | |
|---|---|---|---|
| CN | 201330891 | 10/2009 | |
| EP | 0309596 | 4/1989 | |
| EP | 0498216 | 8/1992 | |
| EP | 0530507 | 3/1993 | |
| FR | 2643914 | 9/1990 | |
| FR | 2652826 | 4/1991 | |
| GB | 1041255 | 9/1966 | |
| JP | H3-120624 | 12/1991 | |
| JP | H10-163674 | 6/1998 | |
| JP | HI-1293532 | 10/1999 | |
| JP | 2003-168710 | 6/2003 | |
| JP | 3097068 | 1/2004 | |
| JP | 2004-190194 | 7/2004 | |
| JP | 2008-135215 | 6/2008 | |
| JP | 2008135215 A * | 6/2008 | |
| TW | M522298 | 5/2016 | |
| TW | 202110575 | 3/2021 | |
| TW | 202116480 | 5/2021 | |
| TW | 202120850 | 6/2021 | |
| VN | 10030757 B * | 1/2022 | ........... B65D 77/067 |
| WO | WO 1996/13680 | 5/1996 | |

OTHER PUBLICATIONS

En.wikipedia.org [online], "Pneumatics," May 14, 2024, retrieved on Sep. 11, retrieved from URL<https://en.wikipedia.org/wiki/Pneumatics>, 5 pages.

Notice of Allowance in Taiwanese Appln. No. 111140691, dated Sep. 2, 2024, 6 pages (with English translation).

Office Action in Taiwanese Appln. No. 111140691, dated May 31, 2024, 6 pages (with English summary).

\* cited by examiner

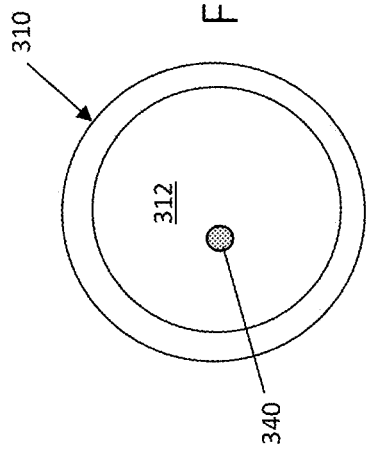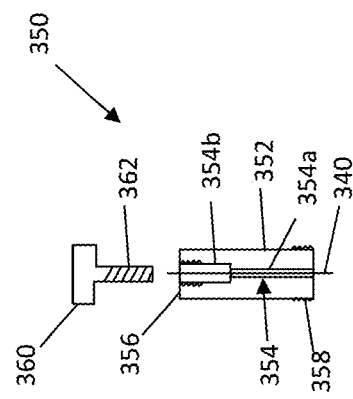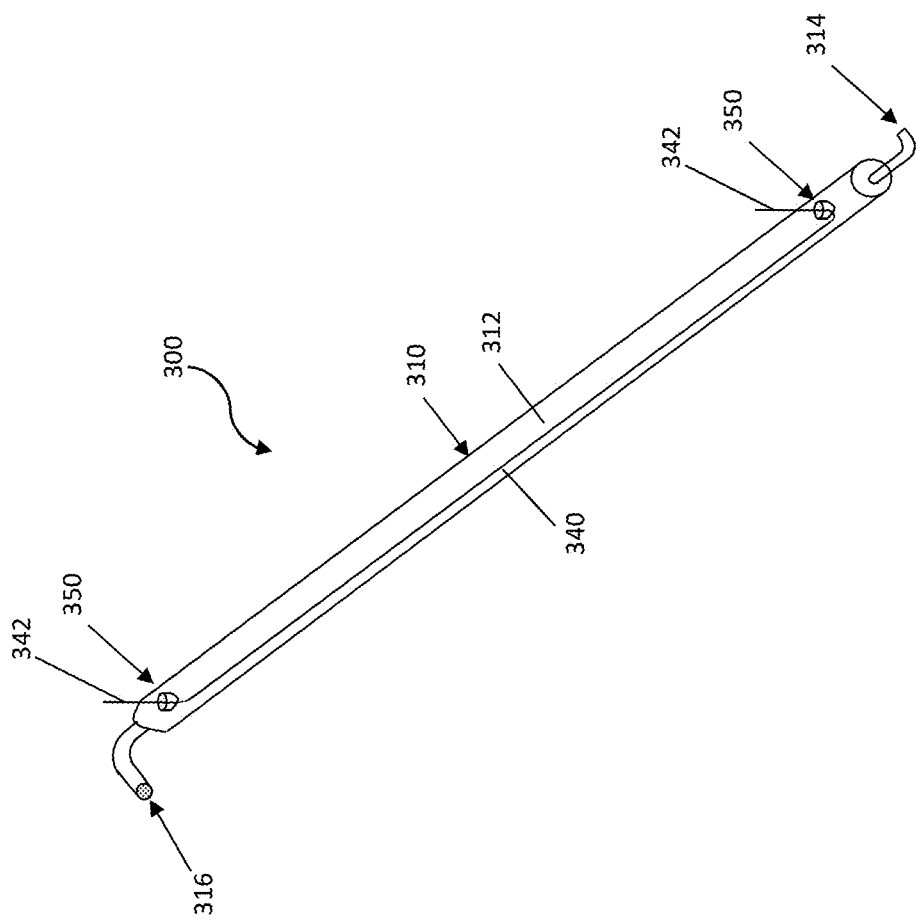

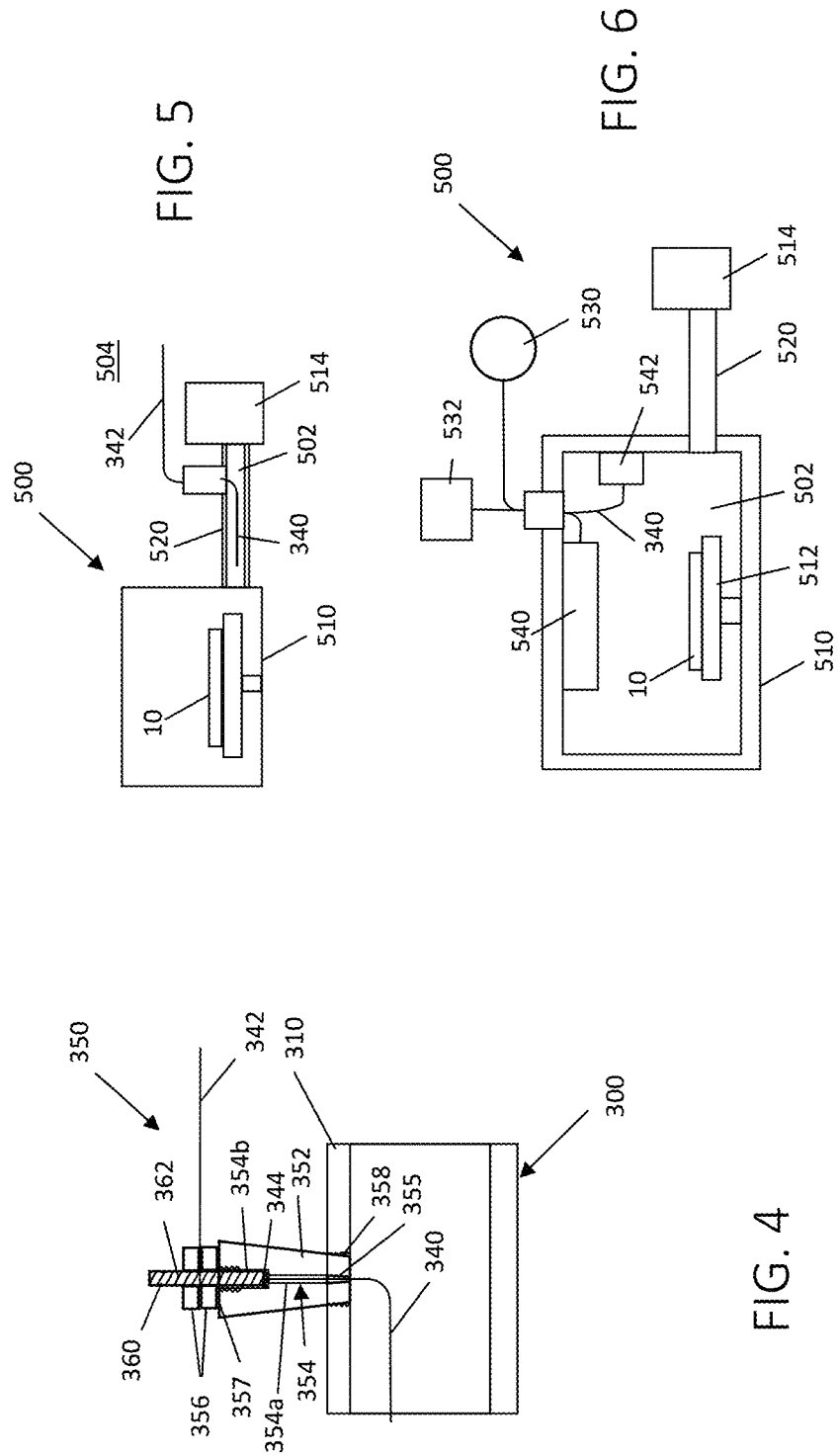

FLUID-TIGHT ELECTRICAL CONNECTION TECHNIQUES FOR SEMICONDUCTOR PROCESSING

CROSS-REFERENCE TO RELATED APPLICATIONS

This application claims the benefit of priority to U.S. Application No. 63/346,811, filed on May 27, 2022, the contents of which are hereby incorporated by reference.

TECHNICAL FIELD

The present disclosure relates to chemical mechanical polishing (CMP), and more particularly to fluid delivery in CMP.

BACKGROUND

An integrated circuit is typically formed on a substrate by the sequential deposition of conductive, semiconductive, or insulative layers on a semiconductor wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed, or until a predetermined thickness of material remains over an underlying layer.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing slurry with abrasive particles is typically supplied to the surface of the polishing pad. A cleaning fluid, e.g., deionized water, can be sprayed onto the polishing pad to remove debris from the polishing process.

SUMMARY

A chemical mechanical polishing assembly includes a chemical mechanical polishing system, a fluid source, and a fluid delivery conduit to carry a fluid from the fluid source into the chemical mechanical polishing system. The polishing system has a platen to support a polishing pad, a carrier head to support a substrate and bring the substrate into contact with the polishing pad, and a motor to cause relative motion between platen and the carrier head. The fluid delivery conduit includes a conductive wire extending through an interior of the conduit to flow electrostatic discharge to a ground, and a wire extraction fitting covering and sealing a location where the conductive wire passes through a wall of the fluid delivery conduit.

In another aspect, a method of fabricating a fluid conduit includes placing a conductive wire through a tubing where the tubing is configured to flow a fluid into a chemical mechanical polishing assembly, and coupling the conductive wire to a ground source to form an electrostatic discharge protective assembly to conduct an electrostatic charge.

In another aspect, an assembly for electrical connection to a volume having a fluid includes a wall that forms a boundary of the volume to contain the fluid, a conductive wire extending through the volume, and an extraction fitting providing a sealed electrical connection through the wall. The extraction fitting includes an annular plastic body having a passage therethrough. The plastic body has a threaded outer surface that is screwed into a threaded aperture in the wall, the conductive wire is inserted into one end of the passage, and a conductive lug is inserted into an opposite end of the passage and contacts the conductive wire. The conductive lug has a threaded outer surface that is screwed into a threaded portion at the opposite end of the passage.

Possible advantages may include, but are not limited to, one or more of the following.

The danger of electrostatic discharge from fluid delivery lines, and thus of damage to fluid delivery lines or other components in a chemical mechanical polishing system, can be reduced. The components of the grounding mechanism can be manufactured easily and at low cost. The fluid flowing through the tubing is not at additional risk of contamination when it interacts with a noble metal. Additionally, the systems and methods disclosed herein are high temperature safe and semiconductor clean room compatible.

The details of one or more implementations are set forth in the accompanying drawings and the description below. Other aspects, features, and advantages will be apparent from the description and drawings, and from the claims.

BRIEF DESCRIPTION OF THE DRAWINGS

FIG. 3A is a schematic view of a fluid delivery line with a conductive wire in a chemical mechanical polishing system.

FIG. 3B is a schematic cross-sectional view of the fluid delivery line of FIG. 3A.

FIG. 3C is a schematic cross-sectional view of a ground extraction fitting assembly.

FIG. 4 is a schematic cross-sectional view of a ground extraction fitting assembly attached to a pipe.

FIG. 5 is a schematic cross-sectional view of an electrical connection extraction fitting assembly attached to a conduit for a semiconductor processing system.

FIG. 6 is a schematic cross-sectional view of an electrical connection extraction fitting assembly attached to a processing chamber of a semiconductor processing system.

Like reference symbols in the various drawings indicate like elements.

DETAILED DESCRIPTION

A chemical mechanical polishing system includes a fairly large number of fluid delivery lines to deliver a fairly large number of fluids, e.g., deionized water, steam, nitrogen gas. For example, a typical system can include fluid delivery lines to carry slurry to the polishing pad, to carry cleaning liquid the polishing pad to remove polishing debris, to carry heated or cooled fluid to the polishing pad to control the temperature of the polishing process, to carry pressurized gas for pneumatic control of the pressure in a carrier head, etc. Static electricity build-up in these fluid delivery lines can caused, e.g., by tribo-electric charging or by electrostatic induction. If the static electricity build-up becomes too large, electrostatic discharge can result, damaging components and tubing along the fluid delivery lines. In particular, static electricity tends to particularly occur in fluid lines that carry hot gas, e.g., steam. The combination of vapor and temperature can result in tribo-electric charging that is not observed in conventional systems that do not use steam.

A traditional approach for electrostatic dissipative (ESD) tubing is to place a conductive layer, e.g., of carbon, on the inside of the tubing. However, particles of the material coating the inside of the tubing can be carried by the fluid to the polishing system, resulting in contamination of and defects on the substrate. Moreover, the polishing environment can be humid and wet with splashing slurry, so a conductive layer on the outside of the tubing can be subject to oxidation or environmental wear.

Other commercially available options for grounding techniques, such as tubing with integrated carbon impregnated on the inside and outside of the tubing, cannot fully dissipate the ESD charge from polymeric fluid lines. Additionally, these methods tend to leak at the ends of the tubing. These problems are exacerbated at high temperatures, an unforeseen problem in chemical mechanical polishing systems, as temperature regulation becomes more important to controlling the process.

A wire that is formed of a conductive noble metal and that extends through the interior of the tubing can ameliorate these problems. Noble metals, such as platinum or gold, do not interact with steam, even at high temperatures. Thus, placement of a noble metal wire inside the tubing is unlikely to result in particulates and unlikely to cause defects in the integrated circuit product. A ground extraction fitting assembly can be designed to maintain a leak-tight tubing path, while also properly introducing a grounding path for the internal noble metal wire. The noble wire can be coupled to a ground source so that the charge created by the friction between the fluid flow and surrounding polymeric tubing can be dissipated.

Figure 1:
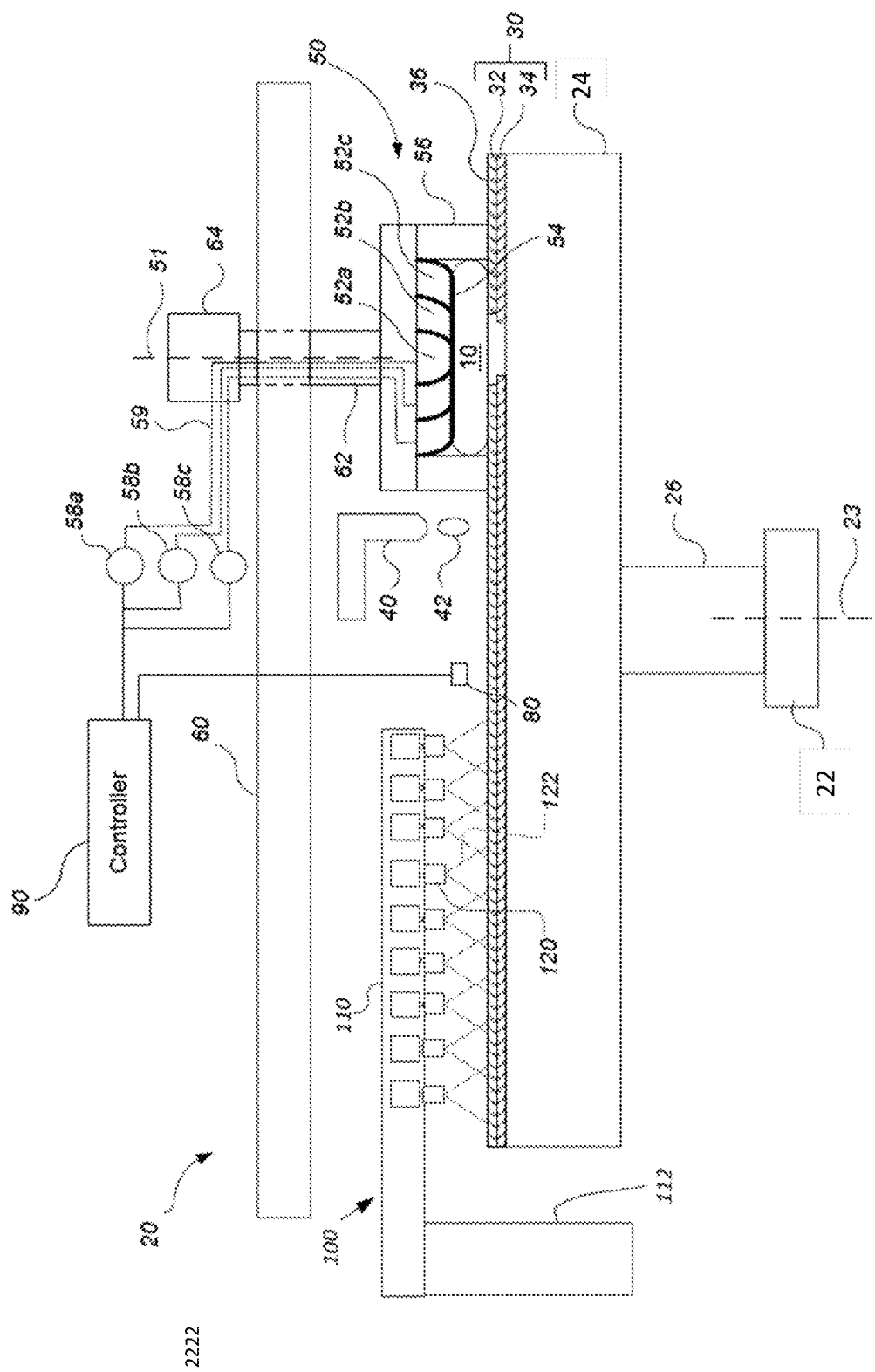
FIG. 1 is a schematic cross-sectional view of an example of a polishing station of the polishing apparatus.
Figure 2:
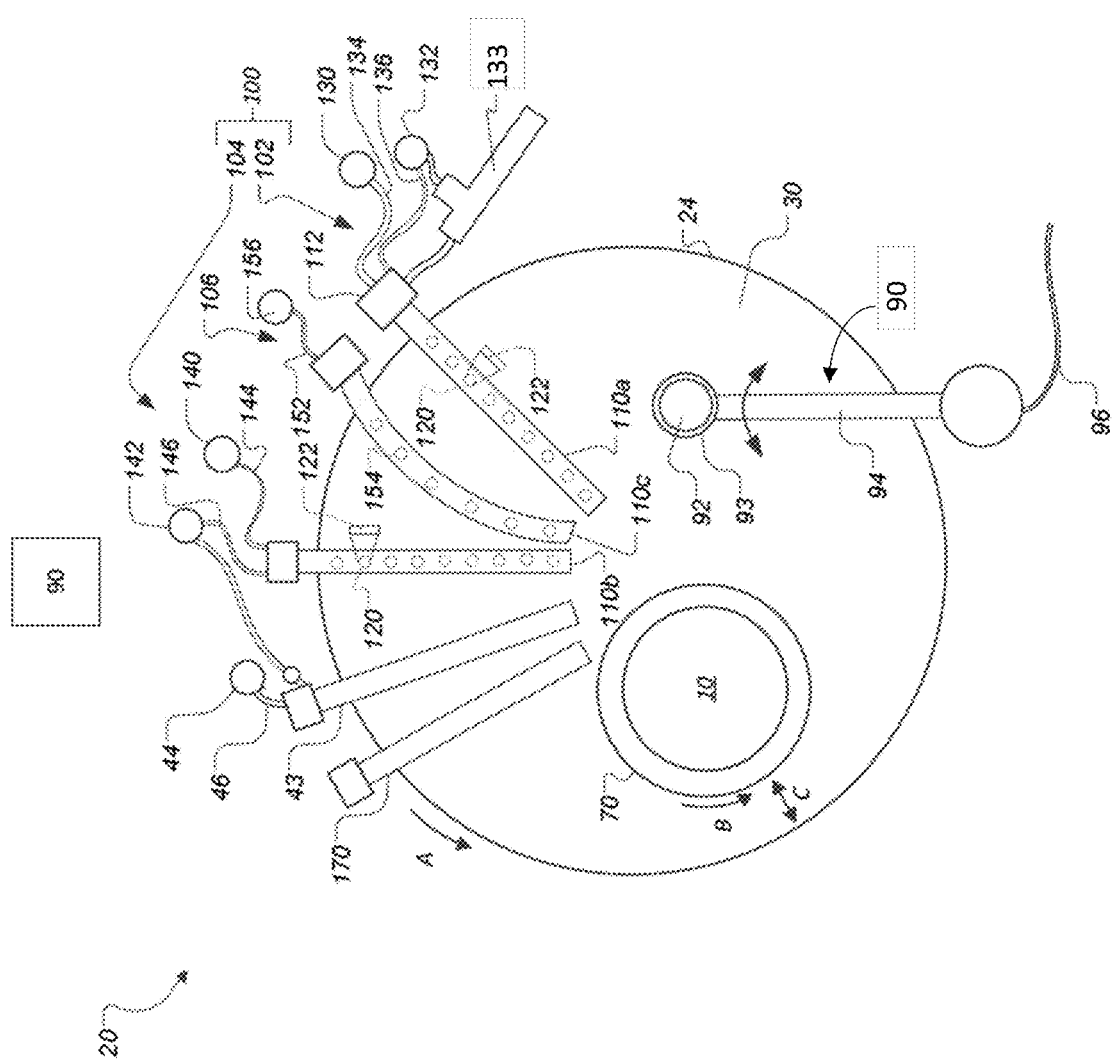
FIG. 2 is a schematic top view of an example polishing station of the chemical mechanical polishing apparatus.

FIGS. 1 and 2 illustrate an example of a polishing system 20 of a chemical mechanical polishing system. The polishing system 20 includes a rotatable disk-shaped platen 24 on which a polishing pad 30 is situated. The platen 24 is operable to rotate (see arrow A in FIG. 2) about an axis 23. For example, a motor 22 can turn a drive shaft 26 to rotate the platen 24. The polishing pad 30 can be a two-layer polishing pad with an outer polishing layer 34 and a softer backing layer 32.

The polishing system 20 can include a supply port 40, e.g., at the end of a slurry dispenser arm 43, to dispense a polishing liquid 42, such as an abrasive slurry, onto the polishing pad 30. The polishing liquid 42 can be delivered from a reservoir 44 (see FIG. 2) through a fluid delivery line 46, e.g., by a pump.

The polishing system 20 can include a pad conditioner 90 with a conditioner disk 92 (see FIG. 2) to maintain the surface roughness of the polishing pad 30. The conditioner disk 92 can be positioned in a conditioner head 93 at the end of an arm 94. Pressuring of the conditioner disk 92 against the polishing pad 30 can be controlled pneumatically, e.g., by pressurized gas, e.g., $N_2$, in a fluid delivery line 96.

A carrier head 50 is operable to hold a substrate 10 against the polishing pad 30. The carrier head 50 can also include a retaining ring 56 to maintain the lateral position of the substrate 10 below the carrier head. The carrier head 50 is suspended from a support structure 60, e.g., a carousel or a track, and is connected by a drive shaft 62 to a carrier head rotation motor 64 so that the carrier head can rotate about a central axis 51. Optionally, the carrier head 50 can oscillate laterally, e.g., on sliders on the carousel, by movement along the track, or by rotational oscillation of the carousel itself.

The carrier head 50 can include a flexible membrane 54 having a substrate mounting surface to contact the back side of the substrate 10, and a plurality of pressurizable chambers 52a-52c to apply different pressures to different zones, e.g., different radial zones, on the substrate 10. Pressure to the chambers 52a-52c can be controlled by pressure regulators 58a-58c. The pressure regulators 58a-58c can couple through pneumatic lines 59 that pass through a rotary union and the drive shaft 62 and carry pressurized gas, e.g., $N_2$, to the respective chambers 52a-52c.

In operation, the platen is rotated about its central axis 25, and the carrier head is rotated about its central axis 51 (see arrow B in FIG. 2) and translated laterally (see arrow C in FIG. 2) across the top surface of the polishing pad 30.

As the carrier head 50 and conditioner head 92 sweep across the polishing pad 30, any exposed surfaces tend to become covered with slurry. For example, slurry can stick to the outer or inner diameter surface of the retaining ring 56. In general, for any surfaces that are not maintained in a wet condition, the slurry will tend to coagulate and/or dry out, resulting in corrosion of the parts and particulates and defects on the substrate. One solution is to clean the components, e.g., the carrier head 50 and conditioner head 92, e.g., with a jet of water or steam. A carrier head cleaner, e.g., steam treating assembly, for the carrier head can be part of the load cup in the polishing system. Similarly, a conditioner head cleaner, e.g., a steam treating assembly, for the conditioner head can be part of a conditioner head cleaning cup. In either case, tubing is needed to carry the cleaning fluid, e.g., liquid water or steam, to the cleaner.

In some implementations, the polishing system 20 includes a temperature sensor 80 to monitor a temperature in the polishing station or a component of/in the polishing station, e.g., the temperature of the polishing pad 30 and/or polishing liquid 38 on the polishing pad. For example, the temperature sensor 80 could be an infrared (IR) sensor, e.g., an IR camera. Alternatively or in addition, the temperature sensor could be a contact sensor rather than a non-contact sensor. For example, the temperature sensor 80 can be thermocouple or IR thermometer positioned on or in the platen 24. In addition, the temperature sensor 80 can be in direct contact with the polishing pad.

The polishing system 20 can also include a temperature control system 100 to control the temperature of the polishing pad 30 and/or polishing liquid 38 on the polishing pad. The temperature control system 100 can include a cooling system 102 and/or a heating system 104. At least one, and in some implementations both, of the cooling system 102 and heating system 104 operate by delivering a temperature-controlled medium, e.g., a liquid, vapor or spray, onto the polishing surface 36 of the polishing pad 30 (or onto a polishing liquid that is already present on the polishing pad).

As shown in FIG. 1, an example temperature control system 100 includes one or more arms 110 that extends over the platen 22 and polishing pad 30. Multiple nozzles 120 are suspended from or formed in each arm 110, and each nozzle 120 is configured to deliver a temperature control fluid onto the polishing pad 30, e.g., spray the fluid onto the polishing pad.

To operate as a cooling system, the temperature control fluid is a coolant. The coolant be a gas, e.g., air, or a liquid, e.g., water. The coolant can be at room temperature or chilled below room temperature, e.g., at 5-15° C. The coolants used in the cooling system 102 can include, for example, cold water, liquid nitrogen, or gas formed from liquid nitrogen and/or dry ice. In some implementations, droplets of liquid, e.g., water, ethanol or isopropyl alcohol, can be added to a gas flow. In some implementations, the cooling system uses a spray of air and liquid, e.g., an aerosolized spray of liquid, e.g., water. In particular, the cooling system can have nozzles that generate an aerosolized spray of water that is chilled below room temperature.

As shown in FIG. 2, the cooling system 102 can include a source 130 of liquid coolant medium and/or a source 132 of gas coolant medium. Liquid from the source 130 and gas from the source 132 can be carried by tubing 134, 136 to and inside the arm 110, before being directed through the nozzle 120, e.g., to form the spray 122. When dispensed, this coolant can be below room temperature, e.g., from −100 to 20° C., e.g., below 0° C.

Gas, e.g., compressed gas, from the gas source 132 can be connected to a vortex tube 133 that can separate the compressed gas into a cold stream and a hot stream, and direct the cold stream to the nozzles 120 onto the polishing pad 30. In some implementations, the nozzles 120 are the lower ends of vortex tubes that direct a cold stream of compressed gas onto the polishing pad 30.

To operate as a heating system, the temperature control fluid is a heated fluid. The heating fluid can be a gas, e.g., steam or heated air, or a liquid, e.g., heated water, or a combination of gas and liquid. The heating fluid is above room temperature, e.g., at 40-120° C., e.g., at 90-110° C. The fluid can be water, such as substantially pure de-ionized water, or water that includes additives or chemicals. In some implementations, the heating system uses a spray of steam, or a combination of steam and liquid water. The steam can include additives or chemicals.

As shown in FIG. 2, the heating system 104 can include a source 140 of heated liquid, e.g., hot water, and/or a source 142 of heated gas, e.g., steam. For example, the source 142 can be boiler. Liquid from the source 140 and gas from the source 142 can be carried by tubing 144, 146 to and inside the arm 110, before being directed through the nozzle 120 to form the spray 122.

Along the direction of rotation of the platen 24, the arm 110b of the heating system 104 can be positioned between the arm 110a of the cooling system 102 and the carrier head 70. Along the direction rotation of the platen 24, the arm 110b of the heating system 104 can be positioned between the arm 110a of the cooling system 102 and the slurry dispenser arm 43. For example, the arm 110a of the cooling system 102, the arm 110b of the heating system 104, the slurry dispenser arm 43 and the carrier head 70 can be positioned in that order along the direction rotation of the platen 24.

Rather than separate arms, the temperature control system 100 can include a single arm to dispense both the coolant and the heating fluid.

Other techniques can be used by the temperature control system 100, in the alternative or in addition, to control the temperature of the polishing process. For example, heated or cooled fluid, e.g., steam or cold water, can be injected into the polishing liquid 42 (e.g., slurry) to raise or lower the temperature of the polishing liquid 42 before the polishing liquid 42 is dispensed. As another example, resistive heaters could be supported in the platen 22 to heat the polishing pad 30, and/or in the carrier head 50 to heat the substrate 10.

Moderating the temperature of the slurry and polishing pad during polishing of a layer allows for increased interaction between charge-carrying abrasives such as cerium oxide. By using temperature control, the material rate of removal can be beneficially increased by both modulating the physical parameters of the polishing pad as well as altering the chemical interaction characteristics between the charged ceria and filler layer.

In some implementations, the controller 90 receives a signal from the temperature sensor 80 and executes a closed loop control algorithm to control the temperature control system 100, e.g., the flow rate, mixing ratio, pressure, or temperature of the coolant or heating fluid relative, so as to maintain the polishing process at a desired temperature.

In some implementations, an in-situ monitoring system measures the polishing rate for the substrate, and the controller 90 executes a closed loop control algorithm to control the temperature control system, e.g., the flow rate or temperature of the coolant or heating fluid relative, so as to maintain the polishing rate at a desired rate.

The polishing system 20 can also include a high pressure rinse system 106. The high pressure rinse system 106 includes a plurality of nozzles 150, e.g., three to twenty nozzles that direct a cleaning fluid, e.g., water, at high intensity onto the polishing pad 30 to wash the pad 30 and remove used slurry, polishing debris, etc. The cleaning fluid can flow from a source 156 of cleaning fluid, e.g., a reservoir of deionize water, through tubing 152 to the nozzles 150.

An example rinse system 106 includes an arm 110c that extends over the platen 24 and polishing pad 30. Along the direction of rotation of the platen 24, the arm 110c of the rinse system 106 can be between the arm 110a of the cooling system 102 and the arm 110b of the heating system 104.

In some implementations, the polishing system 20 includes a wiper blade or body 170 to evenly distribute the polishing liquid 42 across the polishing pad 30. Along the direction of rotation of the platen 24, the wiper blade 170 can be between the slurry dispenser 40 and the carrier head 70.

Although FIG. 2 illustrates separate arms for each subsystem, e.g., the heating system 104, cooling system 102, and rinse system 106, various subsystems can be included in a single assembly supported by a common arm. Various fluid delivery components, e.g., tubing, passages, etc., can extend inside each body.

FIGS. 3A and 3B illustrate a fluid delivery line 300, which can be suitable for use in a chemical mechanical polishing system, e. g., polishing system 20. The fluid delivery line 300 can function as the fluid delivery line 44 for the polishing liquid, pneumatic lines 59 for the carrier head, fluid delivery line 96 for the conditioner head, tubing 134 or 136 for the cooling system, tubing 144 or 146 for the heating system, tubing 152 for the high pressure rinse system, tubing for carrying pneumatic and/or cleaning fluid to the load cup and/or conditioner cleaner cup, e.g., liquid water or steam, to the cleaner.

The fluid delivery line 300 can be particularly well suited for carrying a hot gas, e. g., steam, as the combination of vapor and high temperatures can result in a build-up of electrostatic charge that might not occur in a room temperature gas or liquid. For example, the fluid delivery line 300 can be used as the tubing 146 to deliver hot gas, e. g., steam, from the source 142, e. g., the boiler, or as the tubing to deliver steam for the cleaning the carrier head and/or conditioner head in the load cup and/or conditioner cleaner cup.

The fluid delivery line 300 includes a polymer tubing 310, which can be a material that is electrically insulative and resistant to temperatures of up to 100° C. and is inert to the fluid passing through the fluid delivery line 300 and inert to the polishing process. For example, the polymer tubing can be a perfluoroalkoxy alkane (PFA). The polymer tubing 310 has an interior channel 312 through which the fluid flows. The polymer tubing 310 can have an inlet 314 and an outlet 316 through which the fluid will flow. The fluid delivery line 300 can be formed of multiple pieces, e.g., one piece with a threaded outers surface is screwed into another piece with a threaded inner surface. Additional sealing between the pieces can be provided polytetrafluoroethylene (PTFE) (e.g., Teflon™) tape or a sealing compound. In addition, although FIG. 3A illustrates the fluid delivery line 300 as linear, the fluid delivery line can have one or more bend or curves.

A conductive wire 340 extends through the interior channel 312 of the polymer tubing 310. This conductive wire 340 can be connected to a common ground. For example, the conductive wire 340 can be connected through a fluid-tight ground extraction fitting assembly 350 to a grounding wire 342. The conductive wire 340 can be a noble metal, such gold and platinum. A noble metal, such as platinum or gold, does not interact with steam, even at high temperature, so the danger of particulates and corresponding defects is low. Within the tubing 310 the conductive wire is "bare," i.e., not coated or covered by an insulative sheath, so that electrostatic charge can be drained away by the wire 340. In contrast, the grounding wire 342 can be nearly any wire, e.g., a copper wire with an insulative sheath, e.g., plastic sheath, that is stripped at the connection to the ground extraction fitting assembly 350.

The conductive wire 340 need not extend through the fluid inlet and outlet of the tubing, but can extend along at least a majority, e.g., at least 50%, e.g., at least 75%, e.g., at least 90%, of the distance between the inlet and the outlet. So the ground extraction fitting assembly 342 should be located near, e.g., within the final 10%, e.g., final 5%, of the distance between the inlet and outlet. This guards against static discharge building along the majority of the fluid path.

FIG. 3A illustrates a fluid delivery line 300 with two ground extraction fitting assemblies 350, and the conductive wire 340 extending between and connected to the two ground extraction fitting assemblies 350. However, this is not necessary. In some implementation, a fluid delivery line 300 could have a single ground extraction fitting assembly 350, and one end of the conductive wire 340 can be attached to the ground extraction fitting assembly 350 while the other end of the conductive wire hangs "loose" in the fluid delivery line 300. In some implementation, a fluid delivery line 300 could have a single ground extraction fitting assembly 350, and the conductive wire 340 forms a loop within the fluid delivery line 300 with both ends attached to the sample ground extraction fitting assembly 350. The loop in the wire 340 can extend through a loop in the fluid delivery line itself.

In some implementations, the ground extraction fitting assembly 350 can include a valve with an adjustable inner diameter. The conductive wire can be fed through the opening through the valve, and then the valve can be tightened, e.g., by rotation from the outside of the tubing, so that the inner surface clamps and is sealed against the conductive wire. The valve can be formed of a plastic that is non-reactive to steam and can withstand high temperatures, e.g., PFA or polytetrafluoroethylene (PTFE).

In some implementations, the ground extraction fitting assembly 350 is simply provided by a finely drilled hole through the tubing. In some implementations, the hole is just large enough for one or two of the wires to fit through, and insertion of the wire(s) effectively plugs the hole. If necessary, a sealant could be applied where the wire emerges from the hole and then cured to reduce the likelihood of leakage. The end of a wire can be tapered to aid in insertion and guiding of the wire through the hole.

In some implementations, the extraction fitting assembly 350 includes a conductive grounding lug that provides the electrical connection to the wire 340.

FIGS. 3C and 4 illustrate a mechanism to connect an external grounding wire 342 to the conductive wire 340 inside the fluid delivery line 300. The ground extraction fitting assembly 350 includes a fitting 352, which is an annular body having a passage 354 therethrough. In some implementations, the passage 354 has a narrow portion 354a and a wider portion 354b. The interior surface of the wide portion 354b of the passage 354 can be threaded.

The fitting 352 can be a plastic material that does not corrode or dissolve under exposure to the fluid, e.g., steam, in the fluid delivery line 310. For example, the fitting 352 can be polytetrafluoroethylene (PTFE) (e.g., Teflon™). A bottom portion 358 of the outer surface of the fitting 352 is threaded, and is screwed into a corresponding threaded receiving hole in the tubing 310 to form a seal between the tubing 310 and the fitting 352. Additional sealing between the fitting 352 and tubing 310 pieces can be provided polytetrafluoroethylene (PTFE) (e.g., Teflon™) tape or a sealing compound between the threads.

The conductive wire 340 extends through a lower portion 354a of the passage 354 to contact a conductive lug 360 that is inserted into an upper portion 354b of the passage 354. In some implementations, the fitting 352 is a tapered body, with the lower end being the narrower side of the taper. In this case, as the fitting 352 is screwed into the tubing 310, the passage 354 is pinched inward (at 355) so that the plastic of the fitting 352 is firm contacts and is sealed around the conductive wire 340. This can form a primary seal to prevent escape of fluid in the fluid delivery line 300 through the passage 354.

The lug 360 can have a threaded outer surface 362 that is screwed into a corresponding threaded region 354c of the upper portion 354b of the passage to form a seal between the lug 360 and the fitting 352. This can provide a secondary seal to prevent escape of fluid through the passage 354. Additional sealing between the fitting 352 and tubing 310 pieces can be provided polytetrafluoroethylene (PTFE) (e.g., Teflon™) tape or a sealing compound between the threads.

Two lug nuts 356 can be screwed onto the lug 360, and the external grounding wire 342 can we wound around the shaft of the lug 360 and captured and compressed between the two lug nuts 356.

One technique for assembling the fluid delivery line 300 with the conductive wire 340 is as follows. Initially the conductive wire is inserted and run through the tubing 310. This can be performed before the inlet, outlet, and extraction fitting assembly are attached. For example, the conductive wire can be secured to a guide tube having slightly smaller outer diameter than the inner diameter of the interior channel 312. This guide tube can be used to guide the conductive wire through the tubing 310, e.g., around bends or curves in the tubing 310.

A portion of the conductive wire 340 that extends past the ends of the tubing can then be inserted into the passage 354 in the fitting 352. The narrow portion 354a can be just wide enough for one or two wires to fit through, e.g., the wire sits in the narrow portion 354a in contact with the sidewalls of the narrow portion 354a of the passage 354. The conductive wire 340 can be inserted through passage 354 until the wire extends into the wider portion 354b of the passage 354. Optionally, if the conductive wire 340 extends past the top surface 357 of the fitting 352, the wire 350 can be trimmed so that it does not extend substantially past that top surface 357, e.g., by no more than 1 mm.

Then a conductive lug 360 is inserted into the wide portion 354b of the passage 354. In particular, the conductive lug 360 can have a threaded shaft 362 which is screwed into the threaded wide portion 354b of the passage so that the lug 360 makes firm contact and an electrical connection to the conductive wire 340. The end of the wire 340 can be compressed (at 344) between the bottom of the lug 360 and the bottom of the wider portion 354b of the passage 354 to provide the electrical connection.

Finally, the fitting 350 can be attached either directly to the tubing 312, or to the inlet 314 or outlet 316. In particular, a bottom portion 358 of the outer surface of the fitting 350 can be threaded, and can be screwed into a corresponding threaded receiving hole in the tubing 312, the inlet 314, or the outlet 316b.

The assembly process can include turning the fluid delivery line 300 in advance to prevent clumping, overcoming 90° turns, cutting the wires flush, locking nuts to push on the wires, and taping, e. g., with Teflon tape, the locking nuts to secure them.

In some implementations, the dimensions of the PFA tubing can be ⅛ of an inch thick and up to 7 feet long.

This fluid delivery line can provide a ground path for accumulated charge, and thus reduce the risk of component damage, while still remaining compatible with the polishing process.

Although the description above has focused on fluid delivery lines for a chemical mechanical polishing system, as shown in FIGS. 5 and 6, the ground extraction fitting assembly 350 could be adapted for other uses as a general conductive circuit extraction fitting assembly when a sealed conductive connection is needed between an inner volume 502 of a processing system, e.g., a semiconductor processing system 500, and an outer environment 504, particularly where the inner volume 502 contains steam. A semiconductor processing system typically includes a chamber 510 and a support 512, e.g., a pedestal, edge-support ring or lift pins, to hold a substrate 10 inside the chamber 510, and a source 514 of gas, e.g., a boiler to generate steam or heated water, or a facility gas line. Examples of processing systems include steam treatment, but also rapid thermal processing, etching, and deposition systems where steam is needed either for temperature control of components or as a processing gas.

As shown in FIG. 5, the connection could be through a wall of a line 520 that carries fluid, e.g., steam, from the source 514 to another component the processing system, e.g., for injection into the processing chamber 512 or to provide temperature control for a component, e.g., a wall, support pedestal, etc., in the processing system 500. Alternatively, as shown in FIG. 6, the connection could be through a wall of the processing chamber 510 directly into the interior volume 502 of the chamber. In either case, the wire 340' could be for grounding, but could also be for other electrical purposes, e.g., to carry DC or AC current from a voltage source 530 to an antenna 540, sensor 542, or other component in the inner volume 502, or to carry a signal, e.g., a DC or AC current, from the antenna 540, sensor 542, or other component in the interior volume 502 to an external monitoring system or controller 533.

A number of embodiments of the invention have been described. Nevertheless, it will be understood that various modifications may be made without departing from the spirit and scope of the invention. Accordingly, other embodiments are within the scope of the following claims.

What is claimed is:

1. An assembly for electrical connection to a volume having a fluid, comprising:

a wall that forms a boundary of the volume to contain the fluid;
a conductive wire extending through the volume;
an extraction fitting providing a sealed electrical connection through the wall, wherein the extraction fitting includes an annular plastic body having a passage therethrough, the plastic body has a threaded outer surface that is screwed into a threaded aperture in the wall, the conductive wire is inserted into one end of the passage, and a conductive lug is inserted into an opposite end of the passage and contacts the conductive wire, and the conductive lug has a threaded outer surface that is screwed into a threaded portion at the opposite end of the passage.

2. The assembly of claim 1, wherein the plastic body is tapered such that the one end of the passage is compressed to form a seal between the conductive wire and an inner surface of the passage.

3. The assembly of claim 1, wherein the passage includes a lower portion extending from the one end and an upper portion extending from the opposite end, and the upper portion is narrower than the lower portion.

4. The assembly of claim 3, wherein the conductive wire is compressed between a bottom of the lug and a bottom of the upper portion of the passage.

5. The assembly of claim 1, further comprising a sealant between the threaded outer surface of the plastic body and the threaded aperture in the wall.

6. The assembly of claim 5, wherein the sealant comprises polytetrafluoroethylene (PTFE) tape.

7. The assembly of claim 1, further comprising a sealant between the threaded outer surface of the lug body and the threaded portion of the passage.

8. The assembly of claim 7, wherein the sealant comprises polytetrafluoroethylene (PTFE) tape.

9. The assembly of claim 1, wherein the plastic body is polytetrafluoroethylene (PTFE).

10. The assembly of claim 1, wherein the wall comprises a plastic.

11. The assembly of claim 1, wherein the fluid comprises steam.

12. The assembly of claim 1, wherein the conductive wire is made from a noble metal.

13. The assembly of claim 1, wherein the wall forms a conduit for flow of the fluid to a semiconductor processing system.

14. The assembly of claim 11, wherein the wall forms a processing chamber of a semiconductor processing system.

15. The assembly of claim 14, wherein the semiconductor processing system comprises a deposition system, etching system, or thermal processing system.

16. The assembly of claim 14, wherein the conductive wire is coupled to an antenna or sensor inside the processing chamber.

17. The assembly of claim 1, comprising a monitoring system or a controller, and a second conductive wire connecting the monitoring system or controller to the conductive lug.

18. The assembly of claim 1, comprising a second conductive wire connecting the conductive lug to electrical ground.

* * * * *